United States Patent
Tao et al.

(10) Patent No.: US 10,234,495 B2
(45) Date of Patent: Mar. 19, 2019

(54) DECISION TREE SVM FAULT DIAGNOSIS METHOD OF PHOTOVOLTAIC DIODE-CLAMPED THREE-LEVEL INVERTER

(71) Applicant: Jiangnan University, Wuxi (CN)

(72) Inventors: Hongfeng Tao, Wuxi (CN); Chaochao Zhou, Wuxi (CN); Yan Liu, Wuxi (CN); Yajun Tong, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 93 days.

(21) Appl. No.: 15/551,299

(22) PCT Filed: Dec. 30, 2016

(86) PCT No.: PCT/CN2016/113645
§ 371 (c)(1),
(2) Date: Aug. 16, 2017

(87) PCT Pub. No.: WO2018/045689
PCT Pub. Date: Mar. 15, 2018

(65) Prior Publication Data
US 2018/0238951 A1    Aug. 23, 2018

(30) Foreign Application Priority Data
Sep. 7, 2016    (CN) .......................... 2016 1 0805280

(51) Int. Cl.
*G01R 31/02*    (2006.01)
*H02S 50/10*    (2014.01)
(Continued)

(52) U.S. Cl.
CPC .......... *G01R 31/024* (2013.01); *G01R 31/02* (2013.01); *G06K 9/6296* (2013.01); *H02S 50/00* (2013.01); *H02S 50/10* (2014.12); *G06K 9/62* (2013.01)

(58) Field of Classification Search
CPC ....... G01R 31/024; G01R 31/02; H02S 50/10; H02S 50/00; G06K 9/6296; G06K 9/62
(Continued)

(56) References Cited

FOREIGN PATENT DOCUMENTS

| CN | 102704054 A | 10/2012 |
|---|---|---|
| CN | 102937688 A | 2/2013 |

(Continued)

*Primary Examiner* — Melissa J Koval
*Assistant Examiner* — Courtney G McDonnough
(74) *Attorney, Agent, or Firm* — Gokalp Bayramoglu

(57) ABSTRACT

The present invention discloses a decision tree SVM fault diagnosis method of a photovoltaic diode-clamped three-level inverter in view of fault diagnosis problems of the photovoltaic three-level inverter in a photovoltaic microgrid. Taking an inverting state for example, firstly, analyzing running conditions of an inverter main circuit and performing fault classification, then taking the middle, upper and lower bridge leg voltages as measurement signals, extracting feature signals with a wavelet multiscale decomposition method, and thereby generating a decision tree SVM fault classification model with a particle swarm clustering algorithm, to finally achieve multi-mode fault diagnosis of the photovoltaic diode-clamped three-level inverter. Advantages of the present invention are that, this algorithm can obviously distinguish various fault states of the photovoltaic diode-clamped three-level inverter, complete the failure diagnostic task with fewer classification models And the diagnosis precision is high. The anti-interference capability is strong.

1 Claim, 4 Drawing Sheets

(51) Int. Cl.
*G06K 9/62* (2006.01)
*H02S 50/00* (2014.01)
(58) Field of Classification Search
USPC .......................................................... 324/555
See application file for complete search history.

(56) References Cited

FOREIGN PATENT DOCUMENTS

| | | |
|---|---|---|
| CN | 104698397 A | 6/2015 |
| KR | 20150130594 A | 11/2015 | a: Fault-free b: $S_{a1}$ Open Circuit c: $S_{a2}$ Open Circuit d: $VD_{a5}$ Open Circuit

DECISION TREE SVM FAULT DIAGNOSIS METHOD OF PHOTOVOLTAIC DIODE-CLAMPED THREE-LEVEL INVERTER

CROSS REFERENCE TO RELATED APPLICATIONS

This application is the national phase entry of International Application No. PCT/CN2016/113645, filed on Dec. 30, 2016, which is based upon and claims priority to Chinese Patent Application No. CN201610805280.2, filed on Sep. 7, 2016, the entire contents of which are incorporated herein by reference.

FIELD OF THE INVENTION

The present invention relates to the field of fault diagnosis of power electronic devices, and more particularly to a decision tree SVM fault diagnosis method of a photovoltaic diode-clamped three-level inverter.

BACKGROUND

The global energy crisis and environmental crisis have prompted people to seek cleaner, green new energy, and solar energy has drawn considerable attentions among the clean energies by virtue of advantages, such as pollution-free, sustainability, universality, flexibility and reliability. In a case that the photovoltaic system is increasingly put into operation in the power grid, as the very core part in the photovoltaic system, the photovoltaic inverter contributes to safe, stable and efficient operation of the whole system. Compared to the conventional two-level inverter, the three-level inverter is widely applied in the photovoltaic power generation system, because the switching device thereof has the advantages of being connected in series and voltage-sharing, low in switching loss, low in output voltage harmonic content, high in working efficiency and the like. However, since the number of the switching devices is increased in the three-level inverter, the reliability of the circuit is also reduced correspondingly, and fault on any device may cause abnormal operation of the circuit, or even cause a secondary fault, resulting in enormous economic losses.

Fault diagnosis problems of the photovoltaic three-level inverter mainly lie in three aspects: first, in the aspect of the circuit fault mode, the open circuit fault of a single device is only taken into account, multiple-fault mode diagnosis that multiple devices fail simultaneously has been discussed only until recent years, however, the research in this aspect is still less, the problem analysis is still not comprehensive, and the existing methods for diagnosing a fault that the two switching devices are open-circuited simultaneously all have relatively complicated algorithm structures; second, detection signals mostly are an output voltage and an output current, since there are inductive loads on the output end, the current changes slowly, and such always can increase the fault diagnosis time; third, in the diagnosis algorithm aspect, an intelligent diagnosis algorithm is gradually applied to the fields of the inverter fault diagnosis, such as artificial neural networks, support vector machines and extreme learning machines. Among others, neural networks are used more, but neural networks have more defects in nature, such as more parameters to be configured, slow convergence rate and tending to trap into local optimum, which seriously hinders application of the neural networks.

There are many switching devices for the photovoltaic three-level inverter, the types of fault problems are complicated, and the real-time requirement of the system should be satisfied, the conventional method cannot satisfy practical requirements any more. Here, using the data-driven idea, and data generated constantly during operation of the inverter system for reflecting operating mechanism and status of the system, together with appropriate feature extraction and analysis methods, fault diagnosis and recognition of the photovoltaic inverter can be achieved.

Wavelets analysis is a signal time-frequency domain analysis method, and since it can describe time domains and frequency domains of the signal simultaneously and can acquire localized signal information, wavelets analysis has become the focus in fault feature extraction recently. The particle swarm clustering algorithm is obtained by generalizing the particle swarm optimization algorithm. As a swarm intelligence-based emerging evolutionary computing technology, the particle swarm optimization algorithm is swarm intelligence guidance and optimization search generated by cooperating and competing of individuals in the swarm and has a strong universality. The support vector machine is a machine learning algorithm based on a statistical learning theory, has distinct advantages in solving pattern recognition featured by high-dimension, nonlinearity and small-sample, and also has good practical values and wide application prospects in the power electronics fault diagnosis field.

SUMMARY

One object of the present invention is to provide a decision tree SVM fault diagnosis method of a photovoltaic diode-clamped three-level inverter.

A decision tree SVM fault diagnosis method of a photovoltaic diode-clamped three-level inverter, including: establishing a photovoltaic diode-clamped three-level inverter circuit model; extracting a three-level inverter main circuit open circuit fault feature; constructing a particle swarm clustering fault diagnosis decision tree; training and testing a decision tree support vector machine SVM fault classification model, to finally achieve fault diagnosis of the photovoltaic diode-clamped three-level inverter.

Step One: Establish a Photovoltaic Diode-Clamped Three-Level Inverter Circuit Model The main circuit of the three-level inverter comprising A, B and C three-phase bridge legs, wherein each bridge leg consisting essentially of four main switch tubes, four freewheel diodes and two neutral point clamping diodes, because of the structure of the three-level inverter circuit itself, each switch tube subjects to only half of the maximum voltage of the two-level inverter, and therefore, the three-level inverter can greatly reduce a voltage stress of the switching device, to satisfy high voltage inverting requirements; the main circuit faults of the three-level inverter are mainly open circuit faults including an IGBT open circuit, a fusing of fuses in series and trigger pulse missing fault, as well as open circuit fault of the neutral point clamping diode, and therefore, taking A-phase of the main circuit as an example, faults are classified into three categories and thirteen subcategories, depending on actual operating conditions, comprising:

1) All the IGBT switch tubes operate normally, the inverter is free of fault, and there is one subcategory in total.

2) A single device fails, that is, any of the four power tubes and two neutral point clamping diodes fails, and there are six subcategories in total.

3) Two devices fail, there are two cases for this category, one is that, the two failed switch tubes are not located at the same bridge leg, wherein falls into the fault of a single device on different bridge legs, wherein the two failed switch tubes are not located at the same bridge is referred to the case that a single device fails; the other is that, the two failed switch tubes are located at the same bridge leg, that is, any two of the four switch tubes fail, and there are six subcategories in total.

Step Two: Extract a Three-Level Inverter Main Circuit Open Circuit Fault Feature Each bridge leg voltage with different faults of the three-level inverter main circuit has different projections at each frequency band after decomposition, that is, the main circuit fault can have an influence on energy at each frequency band, generally, the fault enhances or suppresses energy at certain frequency under certain conditions, there will be a difference between fault output and a normal output, and therefore, taking energy at different frequency bands as the fault feature, modeling a photovoltaic diode-clamped three-level inverter main circuit under space vector pulse width modulation (SVPWM) control, after modeling, performing j-layer wavelet multiscale decomposition on the bridge voltage when various faults occur, extracting (j+1) signal features respectively, and reconstructing wavelet multiscale decomposition coefficient, extracting energy at each frequency band, calculating energy of frequency band signals, let $E_n$ be the energy of the n-th decomposition coefficient sequence Sn, then $$E_n = \sum_{k=1}^{N} |X_n|^2 \qquad (1)$$

in the formula, $X_n$, n=0, 1, . . . , j are discrete point magnitudes of a reconstructed signal sequence $S_n$, and then a feature vector can be constructed after obtaining energy of each bridge leg voltage, wherein, the feature vector $T_1$ is:

$$T_1=[E_0\ E_1\ \ldots\ E_j] \qquad (2)$$

Unify dimension, normalizing the feature vector to obtain:

$$T_1'=[E_0/E\ E_1/E\ \ldots\ E_j/E] \qquad (3)$$

wherein, E is the total energy of the signal, each element in $T_1'$ corresponds to energy percentage in each frequency band, processing the upper and lower bridge legs with the same method again to obtain feature vectors $T_2'$ and $T_3'$ respectively, define the fault feature as:

$$T=[T_1'\ T_2'\ T_3'] \qquad (4)$$

Extracting features of the bridge leg voltage under various faults following the processes described above, and finally constructing a data sample.

Step Three: Construct a Particle Swarm Clustering Fault Diagnosis Decision Tree

There are thirteen fault subcategories in total for the three-level inverter, a particle swarm clustering algorithm to constantly classify faults into two categories is needed under the condition that a decision tree is to be constructed to completely distinguish the faults; wherein the particle swarm clustering algorithm comprising initializing the particle swarm clustering algorithm first, randomly initializing the particle swarm, setting parameters such as the number of clusters, the number of particles, and the number of iterations, and then randomly classifying each sample, and after classifying as the initial clustering, calculating parameters, such as a clustering center and an adaptability, setting the initial velocity of the particle zero; in this way, updating a velocities and positions of all the particles according to a particle individual optimal position $p_{id}$ and a globally optimal position $p_{gd}$ obtained from the initial particle swarm with formulas as follows:

$$\omega = \omega_{max} - \frac{iter}{itermax}(\omega_{max} - \omega_{min}) \qquad (5)$$

$$c_1 = R_1 + \frac{iter}{itermax}R_2 \qquad (6)$$

$$c_2 = R_3 - \frac{iter}{itermax}R_4 \qquad (7)$$

$$v_{id}(t+1) = \omega v_{id}(t) + c_1 r_1 (p_{id} - x_{id}(t)) + c_2 r_2 (p_{gd} - x_{id}(t)) \qquad (8)$$

$$x_{id}(t+1) = x_{id}(t) + v_{id}(t+1) \qquad (9)$$

wherein, $\omega$ is a inertia weight; $v_{id}$ is a velocity of the particle; $c_1$ and $c_2$ are acceleration factors; $r_1$ and $r_2$ are random numbers distributed between [0,1]; $R_1=1$; $R_2=0.5$; $R_3=4$; $R_4=2$; $\omega_{max}=1.2$; $\omega_{min}=0.4$; iter is the current number of iterations; itermax is maximum number of iterations; determining clustering partition of each sample according to clustering center coding of the particles and the nearest neighbor rule, and then calculating a new clustering center according to the new clustering partition, updating the adaptability, and comparing the adaptability again, update the $p_{id}$ under the condition that the adaptability is better than the individual optimal position; updating the under the condition that the adaptability is updating the $p_{gd}$ under the condition that the adaptability is better than the globally optimal position $p_{gd}$, ending the algorithm under the condition that the maximum number of iterations is reached, otherwise, continuing the iteration.

To generate the decision tree structure, it is necessary to take all the training sample sets as initial nodes first, classify the initial node into two categories to form two sub-nodes with the particle swarm clustering algorithm, judge whether the sub-node comprises only one type of fault sample, wherein under the condition of the sub-node comprises only one type of fault sample, ending the algorithm, otherwise, continue to process with the particle swarm clustering algorithm, to classify into two new sub-nodes, and then classify constantly until all the sub-nodes comprise only one type of fault sample, and the algorithm ends, in this way, clustering classification is performed on all the fault samples, and a fault diagnosis decision tree is constructed reversely.

Step Four: Train and Test a Decision Tree Support Vector Machine SVM Fault Classification Model classifying the fault data samples into training sets and testing sets in a proportion of 4:1, the training set trains classification models of a support vector machine SVM according to the fault distribution on the decision tree structure; the classification models of the support vector machine SVM all adopt a radial basis kernel function and optimize parameters of the support vector machine SVM, respectively, after training is completed, testing sets are used to test fault diagnosis models of the decision tree support vector machine SVM to obtain indexes comprising diagnosis precision, and finally achieve fault diagnosis of the photovoltaic diode-clamped three-level inverter.

The beneficial effects of the present invention are as follows:

1) the decision tree SVM fault diagnosis method of a diode-clamped three-level inverter is based on a data-driven idea, the core is first to cluster then classify, and combine wavelet multiscale decomposition algorithm, particle swarm clustering algorithm and support vector machine algorithm, to achieve a real-time data fault of the photovoltaic diode-clamped three-level inverter.

2) In the present invention, a particle swarm clustering algorithm is adopted to perform clustering classification on data samples of a diode-clamped three-level inverter, until each subcategory contains only one type of fault information, and then reversely construct the decision tree, so that divisibility among various sub-categories can be as strong as possible, not only improving diagnosis precision but also enhancing the anti-interference capability.

3) The present invention adopts a decision tree fault diagnosis model structure, and the number of classification models to be constructed is few, so that the fault diagnosis efficiency can be improved greatly. The present invention takes the radial basis as a kernel function to optimize various parameters, so that fault diagnosis of the three-level inverter can be achieved effectively.

DETAILED DESCRIPTION

The present invention will be described in detail with reference to the accompanying drawings.

Figure 1:
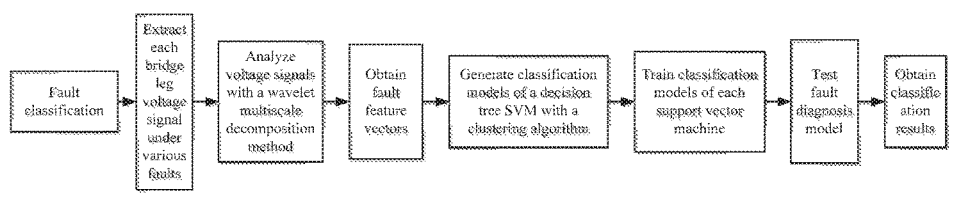
FIG. 1 shows a fault diagnosis flow of a diode-clamped three-level inverter.
Figure 2:
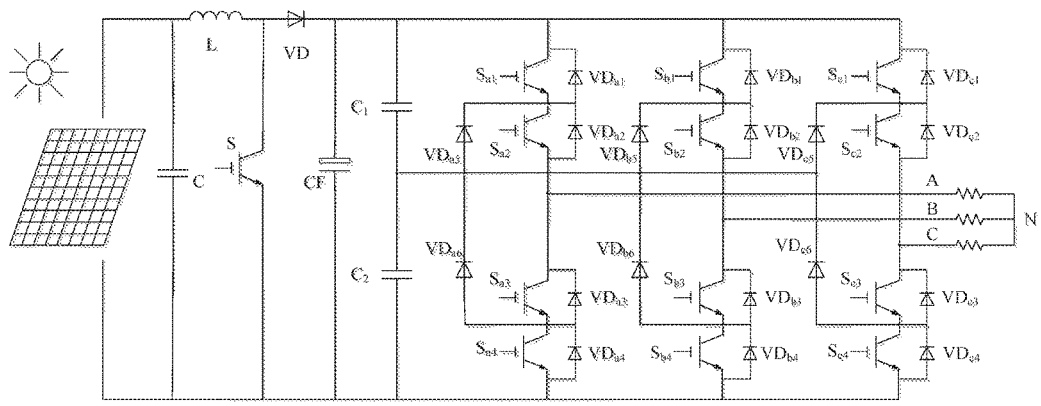
FIG. 2 shows a main circuit topological structure of a diode-clamped three-level inverter.
Figure 3:
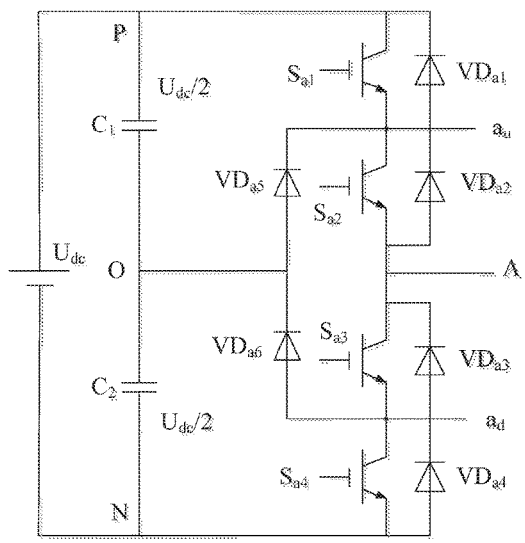
FIG. 3 shows an A-phase topology of an inverter main circuit.

The decision tree SVM fault diagnosis flowchart of the diode-clamped three-level inverter according to the present invention is as shown in FIG. 1, and the specific method embodiments of the present invention include steps as follows:

Refer to FIG. 2, a main circuit topological structural diagram of a diode-clamped three-level inverter is shown, and in order to simplify the analysis, only the working state of A-phase in the inverting state of the inverter is studied, and the circuit topology of the inverter is shown in FIG. 3. There are three working states for A-phase bridge leg:

P state: $S_{a1}$ and $S_{a2}$ are turned on, $S_{a3}$ and $S_{a4}$ are turned off, if the direction of the current is positive, the current flows from P point into A point via $S_{a1}$ and $S_{a2}$, the potential at A point of the output end is equal to the potential at P point after ignoring a forward conduction voltage drop of the switching device, namely, $U_{dc}/2$; if the direction of the current is negative, the current flows from A point into P point via free-wheel diodes $VD_{a1}$ and $VD_{a2}$, the potential at A point of the output end is still equal to the potential at P point.

O state: $S_{a2}$ and $S_{a3}$ are turned on, $S_{a1}$ and $S_{a4}$ are turned off, if the direction of the current is positive, the current flows from the neutral point O into A point via $VD_{a5}$ and $S_{a2}$, the potential at A point of the output end is equal to the potential at O point, i.e., the neutral point potential; if the direction of the current is negative, the current flows from A point into O point via free-wheel diodes $S_{a3}$ and $VD_{a6}$, the potential at A point of the output end is still equal to the potential at O point.

N state: $S_{a3}$ and $S_{a4}$ are turned on, $S_{a1}$ and $S_{a2}$ are turned off, if the direction of the current is positive, the current flows from N point into A point via $VD_{a3}$ and $VD_{a4}$, the potential at A point of the output end is equal to the potential at N point, namely, $-U_{dc}/2$; if the direction of the current is negative, the current flows from A point into N point via $S_{a3}$ and $S_{a4}$, the potential at A point of the output end is still equal to the potential at N point.

Based on the topological structure, faults can be classified into three categories and thirteen subcategories, that is, the fault types of the diode-clamped three-level inverter.

1) All the IGBT switch tubes operate normally, the inverter is free of fault, and there is one subcategory in total.

2) A single device fails, that is, any of the power tubes $S_{a1}$, $S_{a2}$, $S_{a3}$, $S_{a4}$ and clamping diodes $VD_{a5}$, $VD_{a6}$ fails, and there are six subcategories in total.

Figure 4:
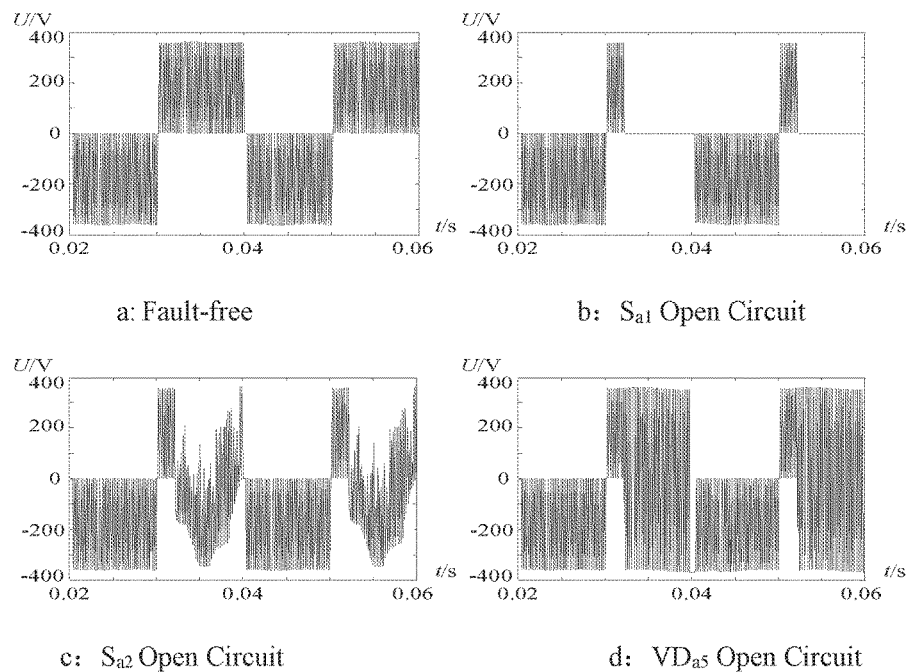
FIG. 4 shows a bridge leg voltage when a single device fails.
Figure 5:
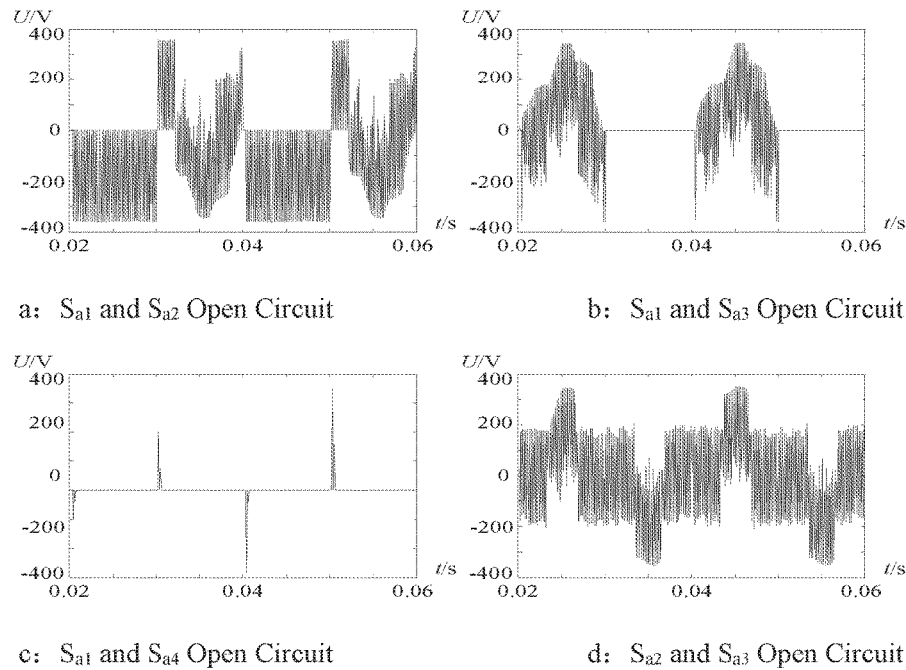
FIG. 5 shows a bridge leg voltage when two devices are open-circuited simultaneously.
Figure 6:
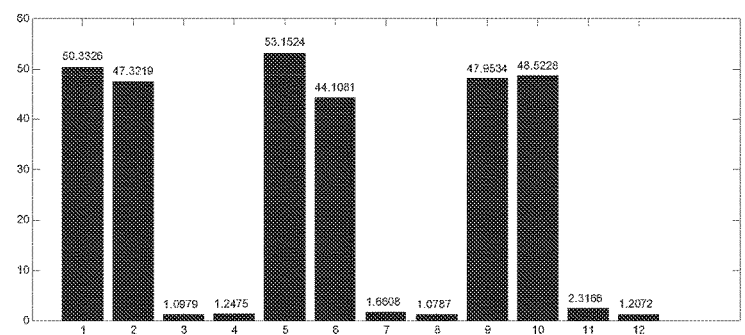
FIG. 6 is a fault feature vector histogram when the inverter is normal.

3) Two devices fail, there are two subcategories for this category, one is that, the two failed switch tubes are not located at the same bridge leg, and such can be referred to the case that a single device fails without taking into account the fault classification; the other is that, the two failed switch tubes are located at the same bridge leg, that is, any group of the power tubes $(S_{a1}, S_{a2})$, $(S_{a1}, S_{a3})$, $(S_{a1}, S_{a4})$, $(S_{a2}, S_{a3})$, $(S_{a2}, S_{a4})$ or $(S_{a3}, S_{a4})$ fail, and there are six subcategories in total;

Establish a three-phase three-level SVPWM inverter model, and select a bridge leg voltage as a research object, to obtain a bridge leg voltage model in a case of various faults, as shown in FIG. 4 and FIG. 5. Considering features of the output voltage, select a sym4 wavelet basis function to perform a three-layer multiscale decomposition on the middle, upper and lower bridge leg voltages, respectively, each bridge leg voltage is decomposed into four small signals, calculate energy of the signal after reconstruction, and normalize the fault feature vector of each bridge leg after unifying dimension. Integrate fault feature vectors of bridge legs, and construct fault feature vectors of the system in a middle-upper-lower sequence, and construct data samples according to different fault types. In particular, when the inverter operates normally, the corresponding fault feature vector histogram is as shown in FIG. 6.

Figure 7:
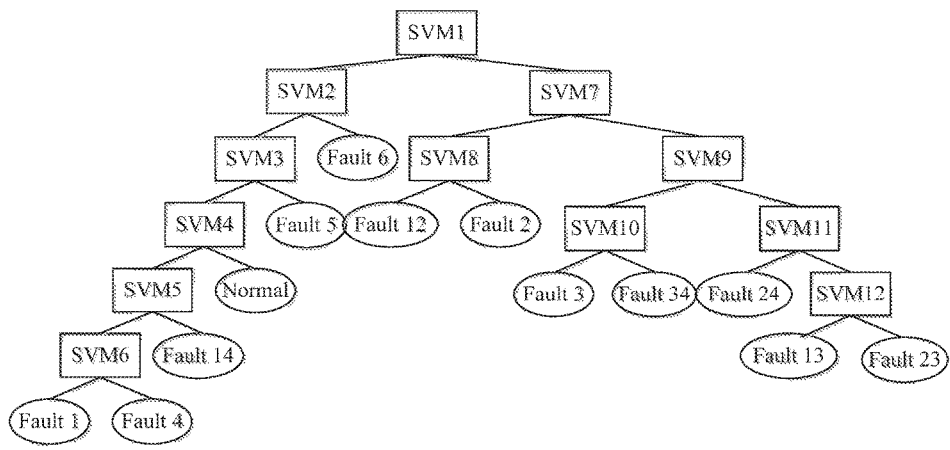
FIG. 7 is a structural diagram of a decision tree after clustering classification.

Perform clustering classification on all the obtained fault samples with the particle swarm clustering algorithm, judge the resulting subcategory, if the subcategory contains only one type of fault samples, then stop classifying, otherwise, continue to perform clustering classification until all the subcategories contain only one type of fault information. After the classification is complete, construct the decision tree reversely, and the structure of the fault diagnosis decision tree finally constructed is as shown in FIG. 7. As can be seen in the figure, only 12 classification models need to be constructed for 13 fault problems, however, it is necessary for SVM with a one-to-one structure to construct $N(N-1)/2$ classification models, i.e., 78 classification models, undoubtedly, adopting the decision tree structure will greatly reduce the number of models to be constructed and improve the operational efficiency.

Classify data samples into training sets and testing sets. Based on the constructed decision tree structure, train classification models of 12 support vector machines, i.e., SVM1 to SVM12, with a radial basis kernel function, respectively, and optimize parameters of each support vector machine. In order to verify the anti-interference capability of the algorithm, add white noise with 10% and 15% signal amplitudes into the original data for comparison, and meanwhile, transversely compare diagnosis precision of the BP Neural Network (BPNN), the Support Vector Machine (SVM) with a one-to-one structure and a Decision Tree Support Vector Machine (DT-SVM), and the final fault diagnosis results are summarized in Table 1. As seen from the table, as the noise increases, the diagnosis precision of each algorithm is reduced to a certain extent, but decrease in the diagnosis precision of the decision tree support vector machine algorithm is relatively low, so the anti-interference capability is high.

TABLE 1

Fault Diagnosis Result

|  | 10% White Noise | 15% White Noise |
| --- | --- | --- |
| BPNN | 96.92% | 92.31% |
| SVM | 97.69% | 93.85% |
| DT-SVM | 98.46% | 96.15% |

The embodiments described above are merely examples for clearly illustrating the present invention, and in no way should be construed to limit the embodiments of the present invention. Persons skilled in the art should appreciate that various other variations and modifications can be made on the basis of the above description.

What is claimed is:

1. A decision tree SVM fault diagnosis method of a photovoltaic diode-clamped three-level inverter, comprising: establishing a photovoltaic diode-clamped three-level inverter circuit model; extracting a three-level inverter main circuit open circuit fault feature; constructing a particle swarm clustering fault diagnosis decision tree; training and testing a decision tree support vector machine SVM fault classification model, to finally achieve fault diagnosis of the photovoltaic diode-clamped three-level inverter;

step one: establishing a photovoltaic diode-clamped three-level inverter circuit model:

the main circuit of the three-level inverter mainly comprising A, B and C three-phase bridge legs, wherein each bridge leg consisting essentially of four main switch tubes, four free-wheel diodes and two neutral point clamping diodes; because of the structure of the three-level inverter circuit itself, each switch tube subjects to only half of the maximum voltage of the two-level inverter, and therefore, the three-level inverter greatly reduces a voltage stress of the switching device to satisfy high voltage inverting requirements; the main circuit faults of the three-level inverter are mainly open circuit faults comprising an IGBT open circuit, a fusing of fuses in series and trigger pulse missing fault, and an open circuit fault of the neutral point clamping diode, and therefore, taking A-phase of the main circuit as an example, faults are classified into three categories and thirteen subcategories, depending on actual operating conditions, comprising;

1) all the IGBT switch tubes operate normally, the inverter is free of fault, wherein there is one subcategory in total;

2) a single device fails, wherein any of the four power tubes and two neutral point clamping diodes fails, wherein and there are six subcategories in total;

3) two devices fail, wherein there are two cases for this category, first, the two failed switch tubes are not located at the same bridge leg, wherein falls into the fault of a single device on different bridge legs, wherein the two failed switch tubes are not located at the same bridge is referred to the case that a single device fails; second, the two failed switch tubes are located at the same bridge leg, wherein any two of the four switch tubes fail, and there are six subcategories in total;

step two: extracting a three-level inverter main circuit open circuit fault feature:

each bridge leg voltage with different faults of the three-level inverter main circuit has different projections at each frequency band after decomposition, wherein the main circuit fault has an influence on energy at each frequency band, wherein the fault enhances or suppresses energy at certain frequency under certain conditions, wherein there is a difference between fault output and a normal output, and therefore, taking energy at different frequency bands as the fault feature, modeling a photovoltaic diode-clamped three-level inverter main circuit under space vector pulse width modulation SVPWM control, after modeling, performing j-layer wavelet multiscale decomposition on the bridge voltage when various faults occur, extracting (j+1) signal features respectively, and reconstructing wavelet multiscale decomposition coefficient, extracting energy at each frequency band, calculating energy of frequency band signals, let $E_n$ be the energy of the n-th decomposition coefficient sequence Sn, then $$E_n = \sum_{k=1}^{N} |X_n|^2 \qquad (1)$$

in the formula, $X_n$, n=0, 1, . . . , j are discrete point magnitudes of a reconstructed signal sequence $S_n$, and then a feature vector is constructed after obtaining energy of each bridge leg voltage, wherein, the feature vector $T_1$ is:

$$T_1 = [E_0 \ E_1 \ \ldots \ E_j] \qquad (2)$$

further unify dimension, normalizing the feature vector to obtain:

$$T_1' = [E_0/E \ E_1/E \ \ldots \ E_j/E] \qquad (3)$$

wherein, E is the total energy of the signal, each element in $T_1'$ corresponds to energy percentage in each frequency band, processing the upper and lower bridge legs with the same method again to obtain feature vectors $T_2'$ and $T_3'$ respectively, define the fault feature as:

$$T = [T_1' \ T_2' \ T_3'] \qquad (4)$$

extracting features of the bridge leg voltage under various faults following the processes described above, and finally constructing a data sample;

step three: constructing a particle swarm clustering fault diagnosis decision tree;

since there are thirteen fault subcategories in total for the three-level inverter, a particle swarm clustering algorithm to constantly classify faults into two categories is needed under the condition that a decision tree is to be constructed to completely distinguish the faults, wherein the particle swarm clustering algorithm comprising initializing the particle swarm clustering algorithm first, randomly initializing the particle swarm, setting parameters comprising a number of clusters, a number of particles, and a number of iterations, and then randomly classifying each sample, and after classifying as the initial clustering, calculating parameters comprising a clustering center and an adaptability, setting the initial velocity of the particle to zero; in this way, updating a velocities and positions of all the particles according to a particle individual optimal position $p_{id}$ and a globally optimal position $p_{gd}$ obtained from the initial particle swarm with formulas as follows:

$$\omega = \omega_{max} - \frac{iter}{itermax}(\omega_{max} - \omega_{min}) \quad (5)$$

$$c_1 = R_1 + \frac{iter}{itermax}R_2 \quad (6)$$

$$c_2 = R_3 - \frac{iter}{itermax}R_4 \quad (7)$$

$$v_{id}(t+1) = \omega v_{id}(t) + c_1 r_1(p_{id} - x_{id}(t)) + c_2 r_2(p_{gd} - x_{id}(t)) \quad (8)$$

$$x_{id}(t+1) = x_{id}(t) + v_{id}(t+1) \quad (9)$$

wherein, $\omega$ is a inertia weight; $v_{id}$ is a velocity of the particle; $c_1$ and $c_2$ are acceleration factors; $r_1$ and $r_2$ are random numbers distributed between [0,1]; wherein $R_1=1$; $R_2=0.5$; $R_3=4$; $R_4=2$; $\omega_{max}=1.2$; $\omega_{min}=0.4$; wherein iter is the current number of iterations; wherein itermax is maximum number of iterations; determining clustering partition of each sample according to clustering center coding of the particles and the nearest neighbor rule, and then calculating a new clustering center according to the new clustering partition, updating the adaptability, and comparing the adaptability again, update the $p_{id}$ under the condition that the adaptability is better than the individual optimal position $p_{id}$; updating the $p_{gd}$ under the condition that the adaptability is better than the globally optimal position $p_{gd}$, ending the algorithm under the condition that the maximum number of iterations is reached, otherwise, continuing the iteration;

to generate the decision tree structure, it is necessary to take all the training sample sets as initial nodes first, classify the initial node into two categories to form two sub-nodes with the particle swarm clustering algorithm, judge whether the sub-node comprises only one type of fault sample, wherein under the condition of the sub-node comprises only one type of fault sample, ending the algorithm, otherwise, continue to process with the particle swarm clustering algorithm, to classify into two new sub-nodes, and then classify constantly until all the sub-nodes comprise only one type of fault sample, and the algorithm ends wherein-clustering classification is performed on all the fault samples, and a fault diagnosis decision tree is constructed reversely;

step four: training a decision tree support vector machine SVM fault classification model:

classifying the fault data samples into training sets and testing sets in a proportion of 4:1, wherein the training set trains classification models of a support vector machine SVM according to the fault distribution on the decision tree structure; the classification models of the support vector machine SVM all adopt a radial basis kernel function and optimize parameters of the support vector machine SVM, respectively, step five: testing a decision tree support vector machine SVM fault classification model;

after the training is completed, testing sets are used to test fault diagnosis models of the decision tree support vector machine SVM to obtain indexes comprising diagnosis precision, and finally achieve fault diagnosis of the photovoltaic diode-clamped three-level inverter.

* * * * *